United States Patent
Yuan (10) Patent No.: US 7,295,821 B2
(45) Date of Patent: Nov. 13, 2007

(54) MULTIPLE BASE STATION AUTOMATIC FREQUENCY CONTROL ARCHITECTURE IN WIRELESS COMMUNICATION SYSTEM

(75) Inventor: Ti-Wen Yuan, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 504 days.

(21) Appl. No.: 10/813,025

(22) Filed: Mar. 31, 2004

(65) Prior Publication Data
US 2004/0198277 A1    Oct. 7, 2004

(30) Foreign Application Priority Data
Apr. 2, 2003  (TW) .............................. 92107567 A (51) Int. Cl.
*H04B 1/18* (2006.01)
(52) U.S. Cl. .................... 455/164.2; 455/316; 455/260
(58) Field of Classification Search ........ 455/313–316, 455/256, 257–260, 264, 265, 75, 76, 230, 455/255, 150.1, 161.1, 164.1, 164.2, 165.1
See application file for complete search history.

(56) References Cited

U.S. PATENT DOCUMENTS

| | | | |
|---|---|---|---|
| 5,634,205 A * | 5/1997 | Kurisu et al. ............. | 455/182.2 |
| 5,774,800 A * | 6/1998 | Mori .......................... | 455/255 |
| 5,909,148 A | 6/1999 | Tanaka ........................... | 331/2 |
| 6,275,699 B1 * | 8/2001 | Ichihara ...................... | 455/434 |
| 6,278,867 B1 | 8/2001 | Northcutt ..................... | 455/255 |
| 2003/0054772 A1 * | 3/2003 | Majaniemi ................. | 455/67.3 |
| 2004/0176148 A1 * | 9/2004 | Morimoto .................... | 455/574 |

* cited by examiner

*Primary Examiner*—Edward F. Urban
*Assistant Examiner*—Nhan T. Le
(74) *Attorney, Agent, or Firm*—Troxell Law Office, PLLC (57) ABSTRACT

An automatic frequency control (AFC) system applies in a mobile station for automatically controlling a local frequency signal to be substantially synchronized with an input signal which is a first received signal $S_H$ from a base station, and for being capable of shifting the frequency of the local frequency signal to be close to that of a second received signal $S_{new}$ from another base station when the input signal is changed from the first received signal $S_H$ to the second received signal $S_{new}$. The AFC system comprises a control module, a memory unit, and an automatic frequency controller. The memory unit stores a plurality of AFC parameter sets; each AFC parameter set corresponds to a base station within the wireless cellular system. When the input signal $S_I$ is changed from the first received signal $S_H$ to the second received signal $S_{new}$, the control module fetches the AFC parameter set, which corresponds to the second base station, from the memory unit; it then applies the fetched AFC parameter set, which corresponds to the second base station, to the automatic frequency controller to shift the frequency of the local frequency signal $f_L$ to be close to that of the second received signal $S_{new}$ from another base station.

20 Claims, 6 Drawing Sheets

MULTIPLE BASE STATION AUTOMATIC FREQUENCY CONTROL ARCHITECTURE IN WIRELESS COMMUNICATION SYSTEM

BACKGROUND OF THE INVENTION

1. Field of the Invention

The present invention relates to an automatic frequency control system, and it especially relates to an automatic frequency control system of a mobile station communicating in a wireless cellular system; the wireless cellular system automatically controls a local frequency signal $f_L$ to be substantially synchronized with an input signal $S_I$ which is a first received signal $S_H$ from a first base station, and it is capable of quickly shifting the frequency of the local frequency signal $f_L$ to be close to that of a second received signal $S_{new}$ from a second base station when the input signal $S_I$ is changed from the first received signal $S_H$ to the second received signal $S_{new}$.

2. Description of the Prior Art

In a wireless cellular system, "synchronization" is one of the major tasks of the receiver. Because of (1) the physical difference among the electronic components (e.g. the frequencies of any two crystal are never exactly the same), (2) the environment effect (e.g. temperature variation will affect the characteristics of the electronic components), and (3) especially the Doppler Effect, etc, the frequency or the carrier frequency of a received signal at the receiver side is usually different from the desired one. Such a case may cause the receiver to fail or perform badly due to the frequency at the receiver side not being well synchronized with that of the received signal.

In order to solve such a problem, all the receivers in conventional wireless cellular systems comprise a device or a software called the automatic frequency controller. The automatic frequency controller can adjust a local frequency signal $f_L$, on which the receiving operation relied on, to approach the frequency of the input signal $S_I$, which is the signal transferred from the base station and received by the receiver. By using the automatic frequency controller, the frequency error $f_E$ between the local frequency signal $f_L$ and the input signal $S_I$ is controlled to be at a level suitable for receiving operation.

In practical use, the automatic frequency controller is of course not a perfect one which means the frequency error $f_E$ is unavoidable. Therefore, the receiver design should be able to tolerate the existence of the frequency error $f_E$. To be more specific, some modules, e.g. the equalizer in the receiver, should be able to operate normally under a certain range of frequency error $f_E$. Please note that a requirement of tolerating a wide range of frequency error $f_E$ will usually not only increase the difficulty of the hardware design but also downgrade the stability of the equalizer. This is definitely not desirable to the system designer since the cost will go higher while the performance of the product will go down.

Figure 1:
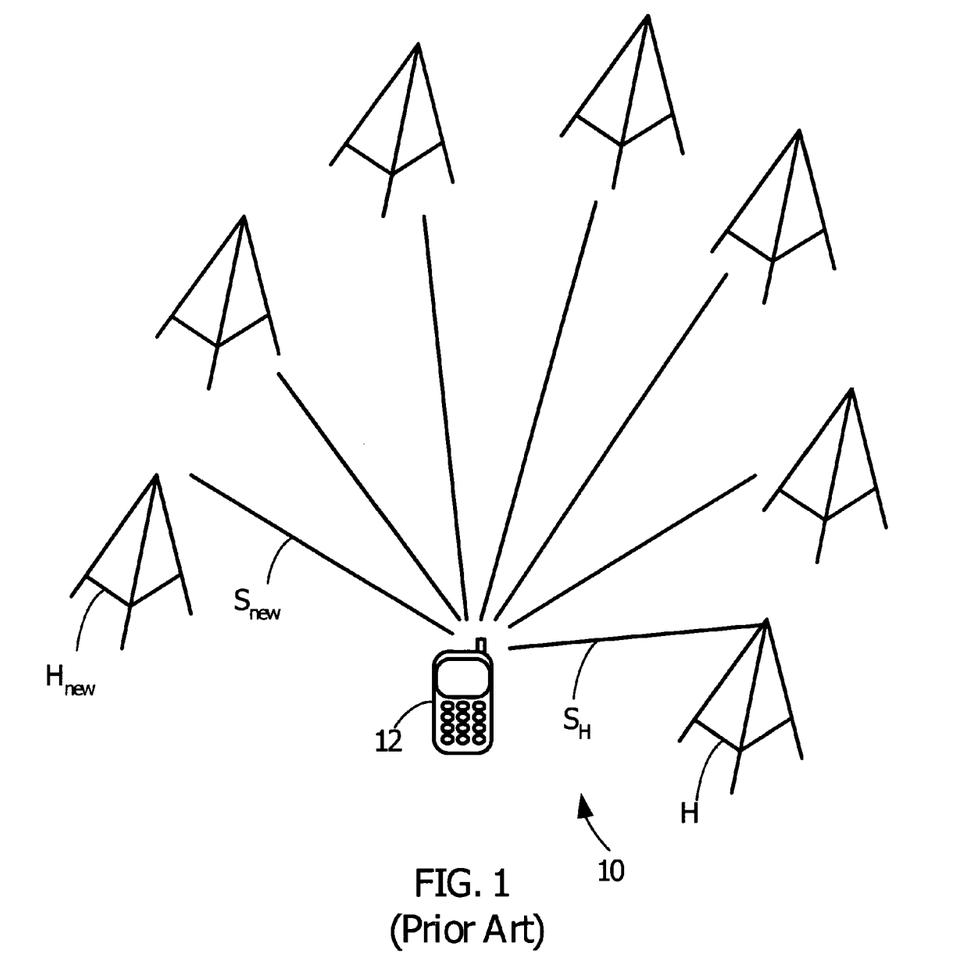
FIG. 1 is a schematic diagram of the wireless cellular system.

Referring to FIG. 1, FIG. 1 is a schematic diagram of the wireless cellular system 10. In the wireless cellular system 10, a mobile station (MS) 12 moves around a plurality of Base stations (BSs) and chooses a suitable BS as its serving BS H. Because both the location of the MS 12 and the overall environment are always changing, in a practical system like the Global System for Mobile (GSM), the MS 12 will not only periodically monitor the signal from the serving BS H but also monitor the signal from the other BSs, which might be the next possible serving BS for the MS 12. If necessary, the MS 12 will then change its serving BS from the current one to a new one to ensure MS's communication.

Figure 2:
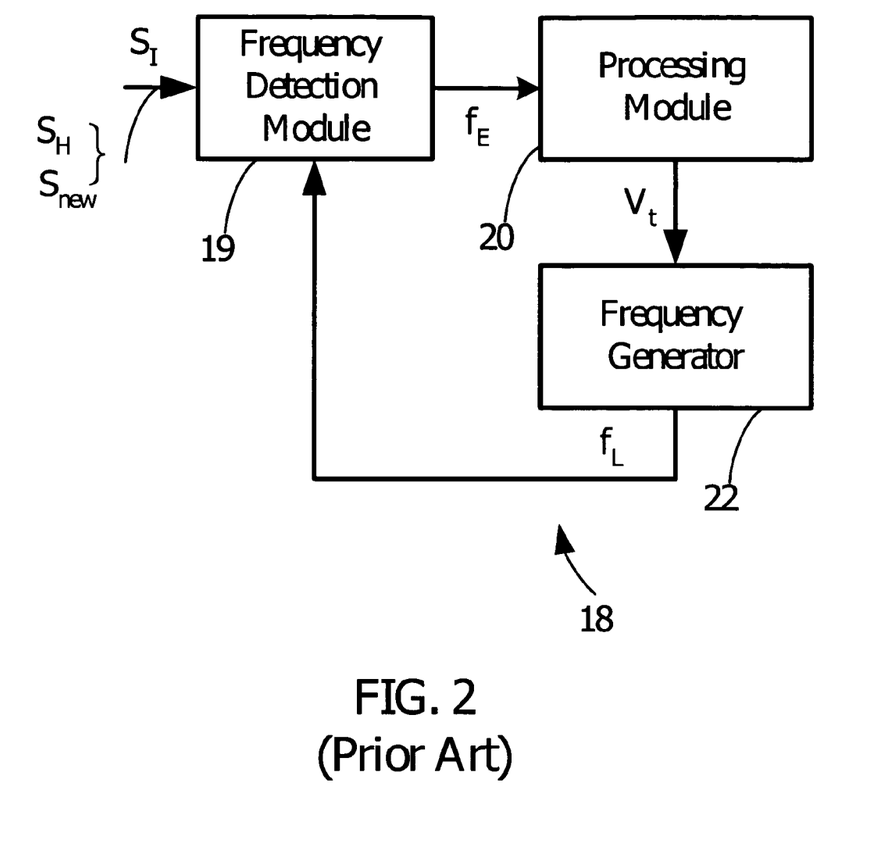
FIG. 2 is a schematic diagram of the automatic frequency controller of the mobile station shown in FIG. 1.

Referring to FIG. 1 and FIG. 2, FIG. 2 is a schematic diagram of the automatic frequency controller 18 of the MS 12 shown in FIG. 1. The conventional automatic frequency controller 18 comprises a frequency detection module 19, a processing module 20, and a frequency generator 22. The frequency detection module 19 is used for comparing the input signal $S_I$ with the local frequency signal $f_L$ and generating the frequency error $f_E$ between the input signal $S_I$ and the local frequency signal $f_L$. The frequency detection module 19 is well known to those skilled in the art. The processing module 20 is used for receiving the frequency error $f_E$ and generating a frequency control signal $V_r$. The frequency generator 22 is used for generating the local frequency signal $f_L$ according to the frequency control signal $V_r$. Practically, the frequency generator 22 is, as an example, a voltage controlled oscillator (VCO). The local frequency signal $f_L$ is then fed back to the frequency detection module 19 to form a feed back control loop. In a normal operation, the automatic frequency controller 18 will make the local frequency signal $f_L$ to be synchronized with the input signal $S_I$ when the automatic frequency controller 18 reaches its steady state.

However, some problems may arise when the input signal $S_I$ is changed from a first received signal $S_H$ from the serving BS H to a second received signal $S_{new}$ from a second BS $H_{new}$ (e.g. for the case that the MS 12 needs to change its serving BS), which means that the frequency of input signal $S_I$ of the automatic frequency controller 18 will suddenly change to a new one. In such a case, at the very beginning, the frequency error $f_E$ in the automatic frequency controller 18 will be increased due to the frequency change of the input signal $S_I$. The processing module 20 will generate the frequency control signal $V_r$ based on the frequency error $f_E$ to control the local frequency signal $f_L$ to approach the input signal $S_I$. The automatic frequency controller 18 will eventually make the local frequency signal $f_L$ to be synchronized with the input signal $S_I$, which is now the second received signal $S_{new}$ from the second BS $H_{new}$, again. However, the automatic frequency controller 18 will need a certain amount of time to recover its synchronized status when the frequency of the input signal $S_I$ is changed. In other words, at the very beginning, when the frequency of the input signal $S_I$ is changed, the frequency of the local frequency signal $f_L$ is still kept at the original one corresponding to the original serving BS H. In the MS 12, the local frequency signal $f_L$ provided by the frequency generator 22 acts as a basic clock signal for the receiving operation. Especially, some modules, e.g. the equalizer, in the receiver of the MS 12 is very sensitive to the frequency error $f_E$ between the local frequency signal $f_L$ and the input signal $S_I$. However, the equalizer of the MS 12 receiver can usually only tolerate a certain range of the frequency error $f_E$ when the MS 12 receiver is communicating with the BS. The situation that the frequency of the input signal $S_I$ is quickly changed may cause too large a frequency error $f_E$, such that the MS 12 receiver can not take it, and the system performance is downgraded. Therefore, it is desirable to resolve such a problem.

SUMMARY OF THE INVENTION

Accordingly, an objective of the invention is to provide an automatic frequency control (AFC) system of a mobile station communicating in a wireless cellular system. The AFC system automatically controls a local frequency signal $f_L$ to be substantially synchronized with an input signal $S_I$ which is a first received signal $S_H$ from a first base station.

According to the present invention, the AFC system is used for automatically controlling a local frequency signal to be substantially synchronized with an input signal, which is a first received signal $S_H$ from a base station, and for being capable of shifting the frequency of the local frequency signal to be close to that of a second received signal $S_{new}$ from another base station when the input signal is changed from the first received signal $S_H$ to the second received signal $S_{new}$. The AFC system comprises a control module, a memory unit, and an automatic frequency controller. The memory unit stores a plurality of AFC parameter sets; each AFC parameter set corresponds to a base station within the wireless cellular system. When the input signal $S_I$ is changed from the first received signal $S_H$ to the second received signal $S_{new}$, the control module fetches the AFC parameter set, which corresponds to the second base station, from the memory unit and applies the fetched AFC parameter set, which corresponds to the second base station, to the automatic frequency controller to shift the frequency of the local frequency signal $F_L$ to be close to that of the second received signal $S_{new}$ from another base station.

According to the AFC system of the present invention, because the AFC system can reduce the frequency error between the local frequency signal $f_L$ and the second received signal $S_{new}$, the present invention has the advantages of reducing the design difficulty of the equalizer, tolerating larger frequency error between the signals of the MS and the BS, and tolerating more serious Doppler Effect that allows faster moving speed of the MS.

The advantage and spirit of the invention may be understood by the following recitations together with the appended drawings.

DETAILED DESCRIPTION OF THE INVENTION

Figure 3:
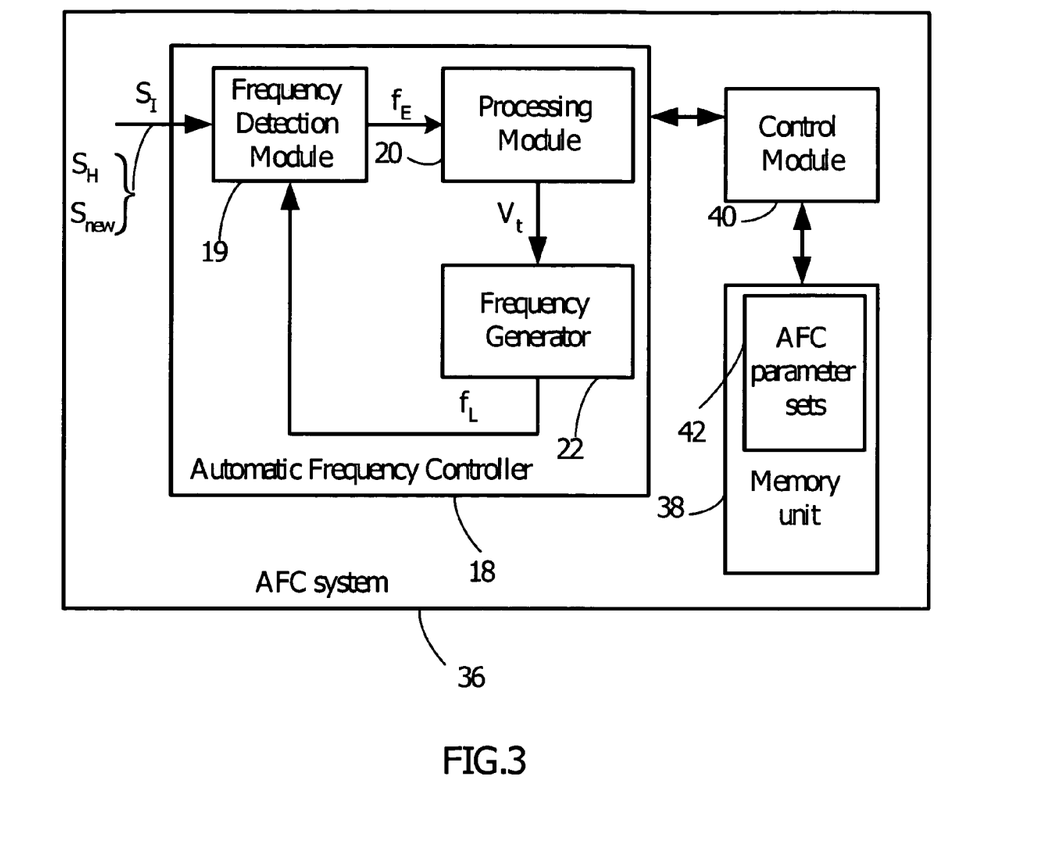
FIG. 3 is a schematic diagram of the automatic frequency control system according to the present invention.

Referring to FIG. 1 and FIG. 3, FIG. 3 is a schematic diagram of the automatic frequency control (AFC) system 36 according to the present invention. The AFC system 36 is applied to a mobile station (MS) 12 in a wireless cellular system 10 for automatically controlling a local frequency signal $f_L$ to be substantially synchronized with an input signal $S_I$ which is a first received signal $S_H$ from a first base station (BS), e.g. the MS's serving BS H, and for being capable of shifting the frequency of the local frequency signal $f_L$ to be close to that of a second received signal $S_{new}$ from a second BS $H_{new}$ when the input signal $S_I$ is changed from the first received signal $S_H$ to the second received signal $S_{new}$.

The AFC system 36 comprises a memory unit 38, a control module 40, and an automatic frequency controller 18. The automatic frequency controller 18 is used for receiving the input signal $S_I$ and generating the local frequency signal $f_L$. The memory unit 38 is used for storing a plurality of AFC parameter sets 42. Each AFC parameter set 42 stored in the memory unit 38 corresponds to a specified BS within the wireless cellular system 10 and will be uploaded to the automatic frequency controller 18 when the MS 12 is going to receive the signal from the specified BS.

The control module 40 is used for fetching the AFC parameter set 42, which corresponds to the specified BS, such as the second base station $H_{new}$, from the memory unit 38. Furthermore, the control module 40 applies the fetched AFC parameter set 42, which corresponds to the second base station $H_{new}$, to the automatic frequency controller 18 to shift the frequency of the local frequency signal $f_L$ to be close to that of a second signal $S_{new}$ from the second BS $H_{new}$ when the input signal $S_I$ is changed from the first received signal $S_H$ to the second received signal $S_{new}$.

In addition, the automatic frequency controller 18 is basically the same as the prior art. Any kind of the prior art automatic frequency controller 18 which is capable of being configured to shift the frequency of the local frequency signal $f_L$, is therefore suitable to be used in the present invention.

The automatic frequency controller 18 comprises a frequency detection module 19, a processing module 20, and a frequency generator 22. The frequency detection module 19 is used for comparing the input signal $S_I$ with the local frequency signal $f_L$ and generating the frequency error $f_E$ between the input signal $S_I$ and the local frequency signal $f_L$. The processing module 20 is used for receiving the frequency error $f_E$ and generating a frequency control signal $V_t$. The frequency generator 22 is used for generating the local frequency signal $f_L$ according to the frequency control signal $V_t$. Practically, the frequency generator 22 is, as an example, a voltage controlled oscillator (VCO). The local frequency signal $f_L$ is then fed back to the frequency detection module 19 to form a feed back control loop.

As an example, each of the AFC parameter set 42, which corresponds to the specified BS, comprises a first AFC parameter AFC_$V_t$. The first AFC parameter AFC_$V_t$, which corresponds to the specified BS, such as the second base station $H_{new}$, represents a value of the frequency control signal $V_t$ which is related to the frequency error $f_E$ between the second received signal $S_{new}$ and the local frequency signal $f_L$.

The first AFC parameter AFC_$V_t$ represents the state of the current processing module 20. By storing the first AFC parameter AFC_$V_t$, the state of the processing module 20 can be recovered by restoring the stored first AFC parameter AFC_$V_t$. Depending on the practical design of the automatic frequency controller 18, other parameters can also be included as the AFC parameter set 42, and the present invention is still applicable. Due to the fact that there may be a time difference between the time $t_0$, at which the AFC parameter set 42 is stored, and the time $t_1$, at which the processing module 20 needs to be recovered, it is preferable that the AFC parameter set 42 further comprises the time information, $t_0$, i.e. a second AFC parameter, so that the processing module 20 can take the time effect into account.

When the input signal $S_I$ is changed from the first received signal $S_H$ to the second received signal $S_{new}$, the control module 40 fetches the AFC parameter set 42, which corresponds to the second base station $H_{new}$, from the memory unit 38; it then applies the fetched AFC parameter set 42, which corresponds to the second base station $H_{new}$, to the automatic frequency controller 18 to shift the frequency of the local frequency signal $f_L$ to be close to that of a second received signal $S_{new}$ from the second BS $H_{new}$.

According to the AFC system 36 of the present invention, when the input signal $S_I$ of the AFC system 36 is changed from the first received signal $S_H$ from the serving BS H to the second received signal $S_{new}$ from the second BS $H_{new}$ (e.g. for the case that the MS 12 needs to change its serving BS), the local frequency signal $f_L$ in the AFC system 36 can be quickly shifted to approach the second received signal $S_{new}$, so that the AFC system 36 provides a better quality of the local frequency signal $f_L$ as a basic clock signal to the receiver, as compared with the prior art automatic frequency controller 18. By employing the AFC system 36 of the present invention, the frequency error tolerance of some modules, e.g. the equalizer, in the receiver can be relaxed while achieving even better performance on Doppler tolerance of the receiver. Taking the Global System for Mobile (GSM) Communications system as an example, the typical allowable MS 12 speed is about 250 kilometers per hour. The main reason for the restriction is the difficulty for a receiver to overcome the serious Doppler Effect, especially when the MS 12 needs to change its serving BS. If the AFC system 36 of the present invention is applied, the allowable MS 12 speed can be increased to around 400 kilometers per hour. Moreover, due to the fact that the difficulty in designing the receiver can be lowered, the cost of the product can be reduced as well.

The control module 40 performs two kinds of functions: the first one is to extract the current AFC parameter set 42 in the operating automatic frequency controller 18 and store the extracted AFC parameter set 42 to the memory unit 38; the second one is to fetch the AFC parameter set 42 which corresponds to the specified BS from the memory unit 38 and applies the fetched AFC parameter set 42 to the automatic frequency controller 18 to shift the frequency of the local frequency signal $f_L$. For example, the control module 40 first extracts the current AFC parameter set 42 within the operating automatic frequency controller 18 and store the extracted AFC parameter set 42, which corresponds to the second BS $H_{new}$, to the memory unit 38. When the MS 12 switches its serving BS from the current serving BS H to the second BS $H_{new}$, then the control module 40 fetches the AFC parameter set 42 which corresponds to the second BS $H_{new}$ from the memory unit 38 and applies the AFC parameter set 42 to the automatic frequency controller 18. By this way, the automatic frequency controller 18 can quickly provide the MS 12 receiver a good local frequency signal $f_L$ whose frequency is already close to that of the second received signal $S_{new}$ from the second BS $H_{new}$ when the MS 12 begins to receive the second received signal $S_{new}$.

The following presents an example on how to apply the present invention to a practical cellular system.

Figure 4:
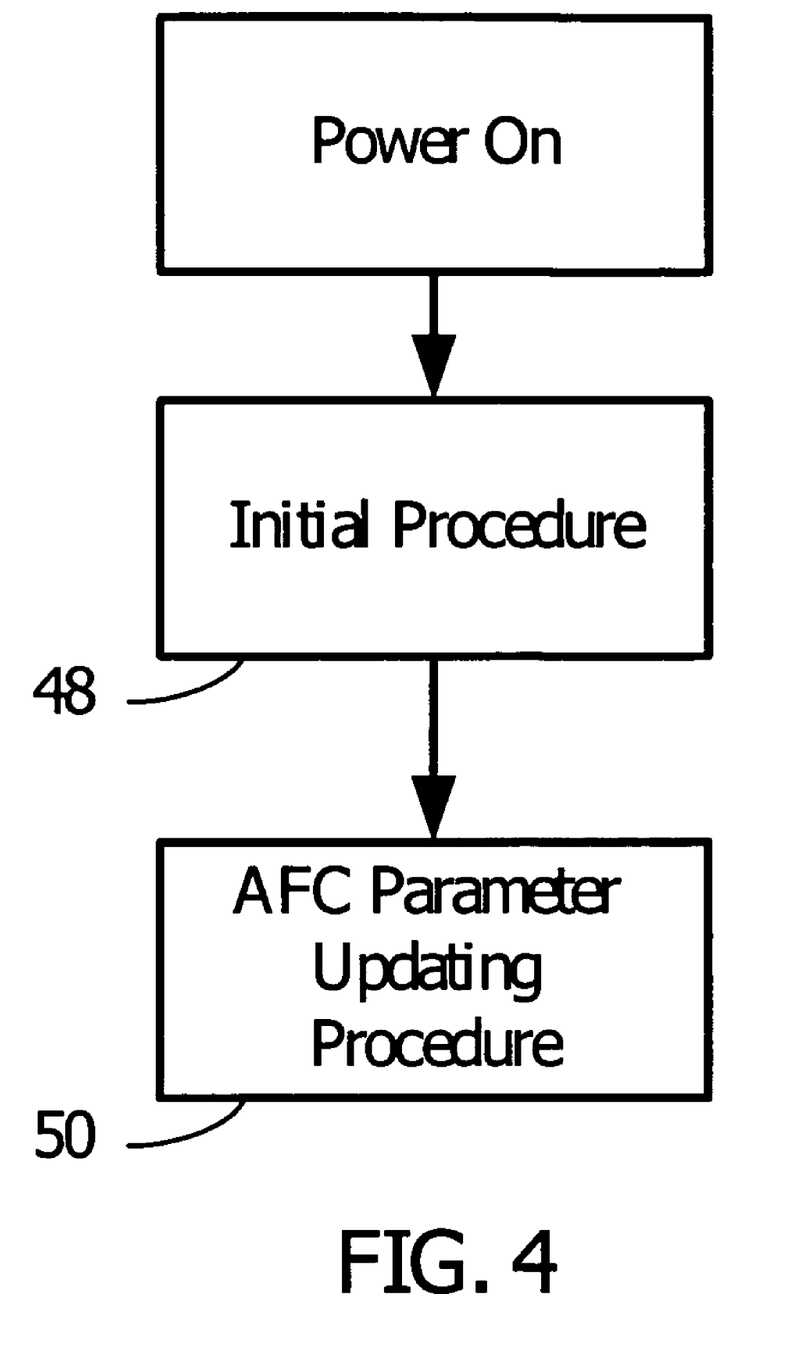
FIG. 4 is a flow chart of the parameter generating procedure performed by the control module shown in FIG. 3.

Referring to FIG. 4, FIG. 4 is a flow chart of the AFC parameter set 42 extracting procedure utilizing the present invention shown in FIG. 3. The AFC parameter set 42 extracting procedure comprises an initial procedure 48 and a parameter updating procedure 50. Normally, the initial procedure 48 is performed, for example, while the MS 12 is turned on (power on) and the parameter updating procedure 50 is a routine procedure to update the AFC parameter sets 42 stored in the memory unit 38.

Figure 5:
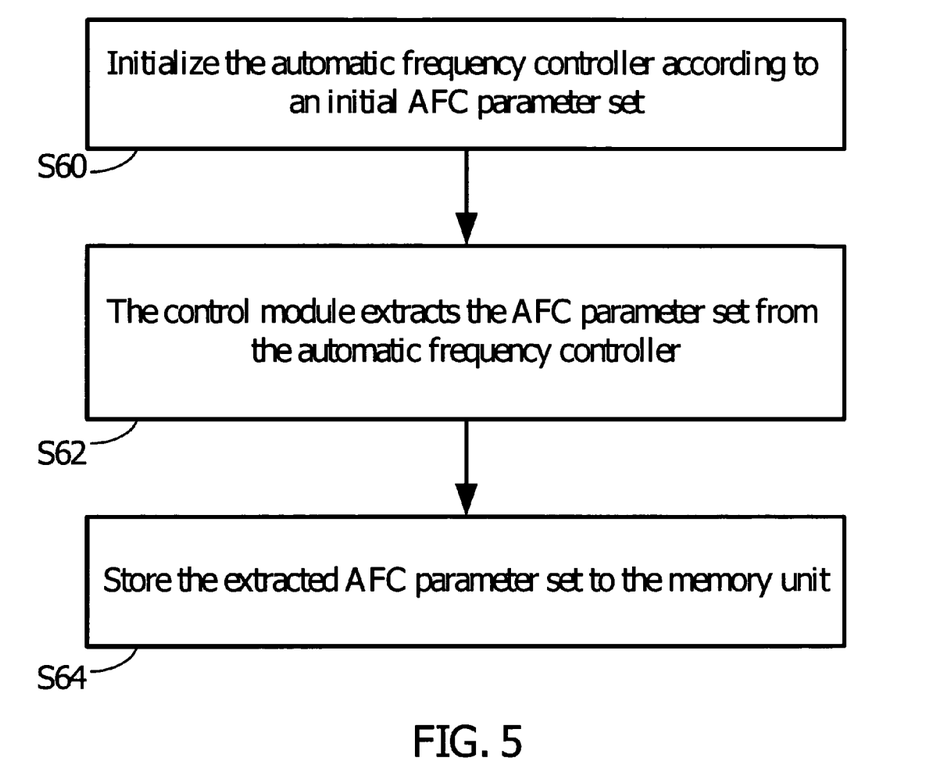
FIG. 5 is a flow chart of the initial procedure shown in FIG. 4.

Referring to FIG. 1, FIG. 3, and FIG. 5, FIG. 5 is a flow chart of the initial procedure 48 shown in FIG. 4. The initial procedure 48 comprises the following steps:

Step S60: Initialize the automatic frequency controller 18 according to an initial AFC parameter set such that the AFC system will track the frequency of the signal from the specified BS based on the initial AFC parameter.

Step S62: After the automatic frequency controller 18 reaches its steady state, the control module 40 extracts the AFC parameter set 42 from the automatic frequency controller 18.

Step S64: Store the extracted AFC parameter set 42 to the memory unit 38.

The MS 12 receiver performs the initial procedure 48, the above Step S60~S64, for each BS in a BS candidate set in the cellular system. For the case of GSM system, the BS candidate set comprises BSs which might become the serving BS to the MS 12. The initial AFC parameter set for the automatic frequency controller 18 for the current specified BS can either be a predetermined parameter set or the obtained AFC parameter set 42 corresponding to the previous specified BS. As a result, the memory unit 38 will store a collection of AFC parameter set 42, each corresponding to a BS in the BS candidate set.

Figure 6:
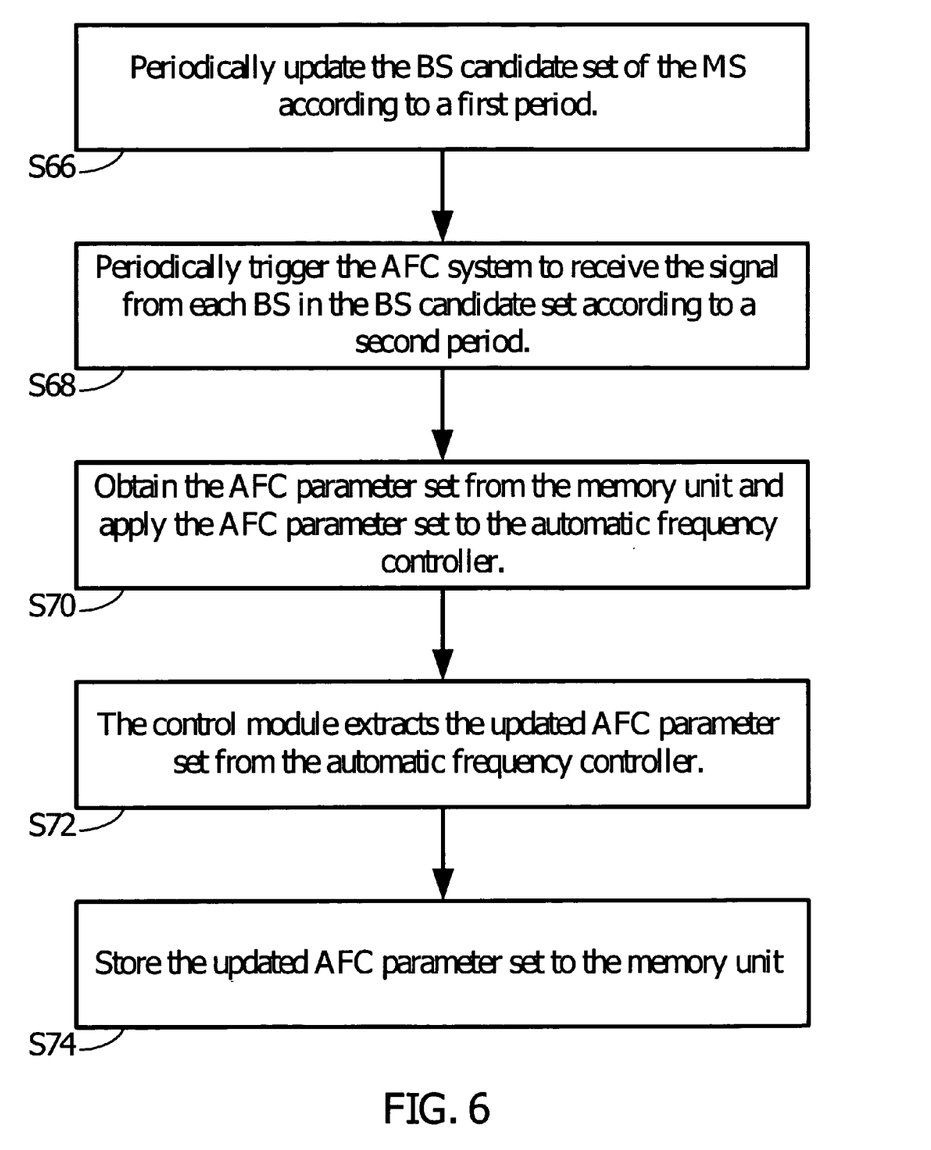
FIG. 6 is a flow chart of the parameter updating procedure shown in FIG. 4.

Referring to FIG. 1, FIG. 3, and FIG. 6, FIG. 6 is a flow chart of the parameter updating procedure 50 shown in FIG. 4. The parameter updating procedure 50 comprises the following steps:

Step S66: Periodically update the BS candidate set of the MS 12 according to a first period.

Step S68: Periodically trigger the AFC system to receive the signal from each BS in the BS candidate set according to a second period.

Step S70: Obtain the AFC parameter set 42 which is corresponding to a specified BS from the memory unit 38 and apply the AFC parameter set 42 to the automatic frequency controller 18.

Step S72: After the automatic frequency controller 18 reaches its steady state, the control module 40 extracts the updated AFC parameter set 42 from the automatic frequency controller 18.

Step S74: Store the updated AFC parameter set 42 to the memory unit 38, so that the AFC parameter set 42 corresponding to the specified BS is updated.

When the MS 12 switches the current serving BS H to the second BS $H_{new}$, the AFC system of the present invention will then pick the AFC parameter set 42, e.g. via a well-known table lookup method, corresponding to the second BS $H_{new}$ from the memory unit 38, and adjust the automatic frequency controller 18 according to the picked AFC parameter set 42.

According to the AFC system 36 of the present invention, when the input signal $S_I$ of the AFC system 36 is changed from the first received signal $S_H$ from the serving BS H to the second received signal $S_{new}$ from the second BS $H_{new}$ (e.g. for the case that the MS 12 needs to change its serving BS), the local frequency signal $f_L$ in the AFC system 36 can be quickly shifted to approach the second received signal $S_{new}$, so that the AFC system 36 provides a better quality of the local frequency signal $f_L$ as a basic clock signal to the receiver as compared with the prior art automatic frequency controller 18. By employing the AFC system 36 of the present invention, the frequency error tolerance of some modules, e.g. the equalizer, in the receiver can be relaxed while achieving even better performance on, Doppler tolerance of the receiver. Taking the Global System for Mobile (GSM) Communications system as an example, the typical allowable MS 12 speed is about 250 kilometers per hour. The main reason for the restriction is the difficulty for a receiver to overcome the serious Doppler Effect, especially when the MS 12 needs to change its serving BS. If the AFC system 36 of the present invention is applied, the allowable MS 12 speed can be increased to, for example, 400 kilometers per hour. Moreover, due to the fact that the difficulty in designing the receiver can be lowered, the cost of the product can be reduced as well.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An automatic frequency control (AFC) system applied in a mobile station of a wireless cellular system for automatically controlling a local frequency signal ($f_L$) to be substantially synchronized with an input signal ($S_I$) which is a first received signal ($S_H$) from a first base station and being capable of shifting the frequency of the local frequency signal ($f_L$) to be close to that of a second received signal ($S_{new}$) from a second base station when the input signal ($S_I$) is changed from the first received signal ($S_H$) to the second received signal ($S_{new}$), the system comprising:

an automatic frequency controller for receiving the input signal ($S_I$) and generating the local frequency signal ($f_L$);

a memory unit for storing a plurality of AFC parameter sets, each AFC parameter set being corresponding to a base station within the wireless cellular system; and a control module;

wherein when the input signal ($S_I$) is changed from the first received signal ($S_H$) to the second received signal ($S_{new}$), the control module fetches the AFC parameter set, which corresponds to the second base station, from the memory unit and applies the fetched AFC parameter set, which corresponds to the second base station, to the automatic frequency controller to shift the frequency of the local frequency signal ($f_L$).

2. The automatic frequency control system of claim 1, wherein the automatic frequency controller comprises:

a frequency detection module for comparing the input signal ($S_I$) with the local frequency signal ($f_L$), and outputting a frequency error ($f_E$) between the input signal ($S_I$) and the local frequency signal ($f_L$);

a processing module for receiving the frequency error ($f_E$) and generating a frequency control signal ($V_t$);

a frequency generator for generating the local frequency signal ($f_L$) according to the frequency control signal ($V_t$).

3. The automatic frequency control system of claim 2, wherein the control module further extracts the AFC parameter set from the automatic frequency controller and stores the AFC parameter set to the memory unit.

4. The automatic frequency control system of claim 3, wherein the AFC parameter set extracted by the control module or stored in the memory unit comprises a first AFC parameter which represents a value of the frequency control signal.

5. The automatic frequency control system of claim 3, wherein the AFC parameter set further comprises a second AFC parameter which represents the time at which the AFC parameter set was extracted.

6. An auxiliary system of an automatic frequency controller in a mobile station of a wireless cellular system, the automatic frequency controller being used for receiving an input signal ($S_I$) which is a first received signal ($S_H$) from a first base station and generating a local frequency signal ($f_L$) which is substantially synchronized with the input signal ($S_I$), the auxiliary system being capable of shifting the frequency of the local frequency signal ($f_L$) to be close to that of a second received signal ($S_{new}$) from a second base station when the input signal ($S_I$) is changed from the first received signal ($S_H$) to the second received signal ($S_{new}$), the auxiliary system comprising:

a memory unit for storing a plurality of AFC parameter sets, each AFC parameter set being corresponding to a base station within the wireless cellular system; and a control module;

wherein when the input signal ($S_I$) is changed from the first received signal ($S_H$) to the second received signal ($S_{new}$), the control module fetches the AFC parameter set, which corresponds to the second base station, from the memory unit and applies the fetched AFC parameter set, which corresponds to the second base station, to the automatic frequency controller to shift the frequency of the local frequency signal ($f_L$).

7. The auxiliary system of claim 6, wherein the automatic frequency controller comprises:

a frequency detection module for comparing the input signal ($S_I$) with the local frequency signal ($f_L$), outputting a frequency error ($f_E$) between the input signal ($S_I$) and the local frequency signal ($f_L$);

a processing module for receiving the frequency error ($f_E$) and generating a frequency control signal ($V_t$);

a frequency generator for generating the local frequency signal ($f_L$) according to the frequency control signal ($V_t$).

8. The automatic frequency control system of claim 7, wherein the control module further extracts the AFC parameter set from the automatic frequency controller and stores the AFC parameter set to the memory unit.

9. The auxiliary system of claim 8, wherein the AFC parameter set extracted by the control module or stored in the memory unit comprises a first AFC parameter which represents a value of the frequency control signal.

10. The auxiliary system of claim 8, wherein the AFC parameter set further comprises a second AFC parameter which represents the time at which the AFC parameter set been extracted.

11. An automatic frequency control (AFC) method applied in a mobile station of a wireless cellular system for automatically controlling a local frequency signal ($f_L$) to be substantially synchronized with an input signal ($S_I$) which is a first received signal ($S_H$) from a first base station and being capable of shifting the frequency of the local frequency signal ($f_L$) to be close to that of a second received signal ($S_{new}$) from a second base station when the input signal ($S_I$) is changed from the first received signal ($S_H$) to the second received signal ($S_{new}$), the method comprising:

(a) receiving the input signal ($S_I$) and generating the local frequency signal ($f_L$);

(b) storing a plurality of AFC parameter sets in a memory unit, each AFC parameter set being corresponding to a base station within the wireless cellular system;

(c) when the input signal ($S_I$) is changed from the first received signal ($S_H$) to the second received signal ($S_{new}$), fetching the AFC parameter set, which corresponds to the second base station, from the memory unit and applying the fetched AFC parameter set, which corresponds to the second base station, to the automatic frequency controller to shift the frequency of the local frequency signal ($f_L$).

12. The automatic frequency control method of claim 11, wherein the step (a) further comprises:

comparing the input signal ($S_I$) with the local frequency signal ($f_L$), outputting a frequency error ($f_E$) between the input signal ($S_I$) and the local frequency signal ($f_L$);

receiving the frequency error ($f_E$) and generating a frequency control signal ($V_t$) according to the frequency error ($f_E$); and generating the local frequency signal ($f_L$) according to the frequency control signal ($V_t$).

13. The automatic frequency control method of claim 12, wherein the the AFC parameter set are extracted from the automatic frequency controller and stored into the memory unit.

14. The automatic frequency control method of claim 13, wherein the AFC parameter set extracted by the control module or stored in the memory unit comprises a first AFC parameter which represents a value of the frequency control signal.

15. The automatic frequency control method of claim 13, wherein the AFC parameter set further comprises a second AFC parameter which represents the time at which the AFC parameter been extracted.

16. An auxiliary automatic frequency control method applied in an automatic frequency controller (AFC) of a mobile station of a wireless cellular system, the automatic frequency controller being used for receiving an input signal ($S_I$) which is a first received signal ($S_H$) from a first base station and generating a local frequency signal ($f_L$) which is substantially synchronized with the input signal $S_I$, the auxiliary method being capable of shifting the frequency of the local frequency signal ($f_L$) to be close to that of a second received signal ($S_{new}$) from a second base station when the input signal ($S_I$) is changed from the first received signal ($S_H$) to the second received signal ($S_{new}$), the method comprising:

(a) storing a plurality of AFC parameter sets in a memory unit, each AFC parameter set being corresponding to a base station within the wireless cellular system;

(b) when the input signal ($S_I$) is changed from the first received signal ($S_H$) to the second received signal ($S_{new}$), fetching the AFC parameter set, which corresponds to the second base station, front the memory unit and applying the fetched AFC parameter set, which corresponds to the second base station, to the automatic frequency controller to shift the frequency of the local frequency signal ($f_L$).

17. The automatic frequency control method of claim 16, wherein the method for generating the local frequency signal ($f_L$) comprises:

comparing the input signal ($S_I$) with the local frequency signal ($f_L$), outputting a frequency error ($f_E$) between the input signal ($S_I$) and the local frequency signal ($f_L$);

receiving the frequency error ($f_E$) and generating a frequency control signal ($V_t$) according to the frequency error ($f_E$); and generating the local frequency signal ($f_L$) according to the frequency control signal ($V_t$).

18. The automatic frequency control method of claim 17, wherein the the AFC parameter set are extracted from the automatic frequency controller and stored into the memory unit.

19. The automatic frequency control method of claim 18, wherein the AFC parameter set extracted by the control module or stored in the memory unit comprises a first AFC parameter which represents a value of the frequency control signal.

20. The automatic frequency control method of claim 18, wherein the AFC parameter set further comprises a second AFC parameter which represents the time at which the AFC parameter set been extracted.

* * * * *